United States Patent
Goto et al.

(10) Patent No.: US 9,594,222 B2
(45) Date of Patent: Mar. 14, 2017

(54) HEAT DISSIPATION STRUCTURE AND OPTICAL TRANSCEIVER

(71) Applicant: Mitsubishi Electric Corporation, Chiyoda-ku (JP)

(72) Inventors: Hideki Goto, Chiyoda-ku (JP); Naoto Himura, Chiyoda-ku (JP); Noriyuki Tani, Chiyoda-ku (JP); Seiji Haga, Chiyoda-ku (JP); Masayoshi Tamura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/762,069

(22) PCT Filed: Dec. 13, 2013

(86) PCT No.: PCT/JP2013/083489
§ 371 (c)(1),
(2) Date: Jul. 20, 2015

(87) PCT Pub. No.: WO2014/132524
PCT Pub. Date: Sep. 4, 2014

(65) Prior Publication Data
US 2015/0355425 A1   Dec. 10, 2015

(30) Foreign Application Priority Data
Feb. 28, 2013 (JP) ................... 2013-039187

(51) Int. Cl.
*G02B 6/42* (2006.01)
*H05K 7/20* (2006.01)
*G02B 6/38* (2006.01)

(52) U.S. Cl.
CPC ......... *G02B 6/4269* (2013.01); *G02B 6/4246* (2013.01); *H05K 7/2039* (2013.01);
(Continued)

(58) Field of Classification Search
CPC ..... H01L 33/54; G02B 6/4204; G02B 6/3873; G02B 6/4201; G02B 6/3897; G02B 6/43;
(Continued)

(56) References Cited

U.S. PATENT DOCUMENTS

2002/0182397 A1* 12/2002 Whatley ................. F28F 3/022
428/297.4
2004/0037515 A1   2/2004 Wisecarver
(Continued)

FOREIGN PATENT DOCUMENTS

JP    5-235484 A    9/1993
JP    7-84156 A    3/1995
(Continued)

OTHER PUBLICATIONS

International Search Report Issued Jan. 28, 2014 in PCT/JP13/083489 Filed Dec. 13, 2013.
(Continued)

*Primary Examiner* — Thomas A Hollweg
*Assistant Examiner* — Mary A El Shammaa
(74) *Attorney, Agent, or Firm* — Oblon, McClelland, Maier & Neustadt, L.L.P.

(57) ABSTRACT

There are provided a heat transfer part 21 having heat-receiving surfaces 211a and 211b which have curved surface shapes along side surfaces 111 and 121 of a stem 11 and a cylindrical part 12 and in which the stem 11 and the cylindrical part 12 can be fitted, and heat-dissipating surfaces 212a and 212b provided with projected and retracted portions 213a and 213b; and a casing 22 having the optical distributor 1 and the heat transfer part 21 mounted thereon, and having heat-receiving surfaces 222a and 222b provided with projected and retracted portions 223a and 223b engaged with the projected and retracted portions 213a and 213b.

12 Claims, 10 Drawing Sheets

(52) U.S. Cl.
CPC .......... *G02B 6/3873* (2013.01); *G02B 6/4201* (2013.01); *G02B 6/4204* (2013.01)

(58) Field of Classification Search
CPC ............ H01S 5/0612; G02F 1/133606; H04Q 2201/804
See application file for complete search history.

(56) References Cited

U.S. PATENT DOCUMENTS

| | | | | |
|---|---|---|---|---|
| 2004/0231390 | A1* | 11/2004 | Fujioka | B21C 23/14 72/269 |
| 2005/0135757 | A1 | 6/2005 | Wisecarver | |
| 2005/0145369 | A1* | 7/2005 | Huang | F28D 15/0275 165/104.11 |
| 2005/0185899 | A1 | 8/2005 | Lo et al. | |
| 2006/0081600 | A1* | 4/2006 | Kopp | B01L 7/52 219/439 |
| 2006/0107986 | A1* | 5/2006 | Abramov | F25B 21/02 136/204 |
| 2008/0031574 | A1 | 2/2008 | Tanaka | |
| 2009/0203082 | A1* | 8/2009 | Schlaubitz | B01L 7/52 435/91.2 |
| 2010/0163915 | A1* | 7/2010 | Herrmann | H01L 33/0079 257/99 |
| 2010/0165453 | A1* | 7/2010 | Morikawa | G02F 1/3775 359/328 |
| 2010/0202942 | A1* | 8/2010 | Feinstein | B01J 19/32 422/310 |
| 2011/0089830 | A1* | 4/2011 | Pickard | F21K 9/135 315/32 |
| 2011/0285224 | A1* | 11/2011 | Iki | H02K 3/47 310/64 |
| 2012/0187430 | A1* | 7/2012 | West | H01L 25/0753 257/88 |
| 2013/0020050 | A1* | 1/2013 | Holman | H01L 23/367 165/67 |
| 2013/0199770 | A1* | 8/2013 | Cherian | F28F 3/00 165/185 |

FOREIGN PATENT DOCUMENTS

| | | |
|---|---|---|
| JP | 2000-31583 A | 1/2000 |
| JP | 2005-234464 A | 9/2005 |
| JP | 2005-317925 A | 11/2005 |
| JP | 2007-273497 A | 10/2007 |
| JP | 2007-287850 A | 11/2007 |
| JP | 2009-16456 A | 1/2009 |
| JP | 2011-205102 A | 10/2011 |
| JP | 2012-42719 A | 3/2012 |

OTHER PUBLICATIONS

Japanese Office Action mailed Sep. 6, 2016 in Japanese Patent Application 2015-502725 w/partial English translation.
Office Action issued Nov. 28, 2016 in Korean Patent Application No. 10-2015-7023214 (with partial English language translation).

* cited by examiner

Optical Axis Adjustment
Tolerance (x Axis),
Optical Distributor Assembly
Tolerance (z Axis)
= Filled with Grease
(Shaded Area)

FIG. 6B

Optical Axis Adjustment
Tolerance
= Filled with Grease
(Shaded Area)

HEAT DISSIPATION STRUCTURE AND OPTICAL TRANSCEIVER

TECHNICAL FIELD

The present invention relates to a heat dissipation structure that dissipates heat of an optical distributor having a stem on which a semiconductor optical element is mounted and a cylindrical part that covers the semiconductor optical element on the stem, and relates to an optical transceiver that includes the optical distributor and the heat dissipation structure.

BACKGROUND ART

In a device that performs optical communications (optical distributor), a heat generation density is increased in order to respond to market needs for an improvement in performance and a reduction in size, and thus, a heat dissipation structure that dissipates heat of the optical distributor poses a problem.

Accordingly, for example, in a technique disclosed in Patent Document 1, a heat dissipation structure that uses a difference in thermal conductivity between a resin and a metal is mounted to an optical distributor. In this heat dissipation structure, a stem of the optical distributor is sandwiched between heat transfer parts made of the resin from above and below, and the upper and lower heat transfer parts are coupled to each other with a metal frame having a coefficient of thermal expansion lower than those of the stem and the heat transfer parts, whereby expansion of the resin during heat generation is suppressed by the metal frame. Thus, during the heat generation, the stem and the heat transfer parts are brought into tight contact with each other to reduce thermal resistance thereof, and thus, a heat dissipation efficiency thereof is increased.

CITATION LIST

Patent Document

Patent Document 1: Japanese Patent Application Laid-open No. 2007-273497

SUMMARY OF THE INVENTION

Problems to be Solved by the Invention

However, the technique disclosed in Patent Document 1 has a problem that a contact area between the heat transfer part and a casing is small, and hence, the heat dissipation efficiency is poor.

The present invention has been made to solve the foregoing problem, and an object of the invention is to provide the heat dissipation structure and the optical transceiver capable of efficiently dissipating the heat of the optical distributor.

Means for Solving the Problems

A heat dissipation structure according to the invention includes: a heat transfer part having a heat-receiving surface which has a curved surface shape along side surfaces of a stem and a cylindrical part and in which the stem and the cylindrical part can be fitted, and having a heat-dissipating surface which is provided with a first projected and retracted portion; and a casing having an optical distributor and the heat transfer part mounted thereon and having a heat-receiving surface provided with a second projected and retracted portion engaged with the first projected and retracted portion.

In addition, a heat dissipation structure according to the invention includes: a heat transfer part having a heat-receiving surface which has a curved surface shape along side surfaces of a stem and a cylindrical part and in which the stem and the cylindrical part can be fitted, and having a heat-dissipating surface provided with a groove portion; and a casing having an optical distributor and the heat transfer part mounted thereon, and having a heat-receiving surface provided with a projected portion engaged with the groove portion.

Effect of the Invention

According to the invention, since it is configured as described above, a heat dissipation efficiency thereof is increased due to an increase in a contact area between the heat transfer part and the casing to thereby efficiently dissipate the heat of the optical distributor. As a result, it is possible to achieve an increase in the heat generation density of the optical distributor, a reduction in size of the casing, and enlargement of an operating temperature range to a temperature increase.

BRIEF DESCRIPTION OF THE DRAWINGS

FIGS. 6A, 6B are views for explaining a gap between the heat transfer part and the casing in Embodiment 1 of the invention, and FIG. 6A is a top view and FIG. 6B is a front view.

MODES FOR CARRYING OUT THE INVENTION

Hereinafter, embodiments of the present invention will be described in detail with reference to the drawings.

Embodiment 1

Figure 1:
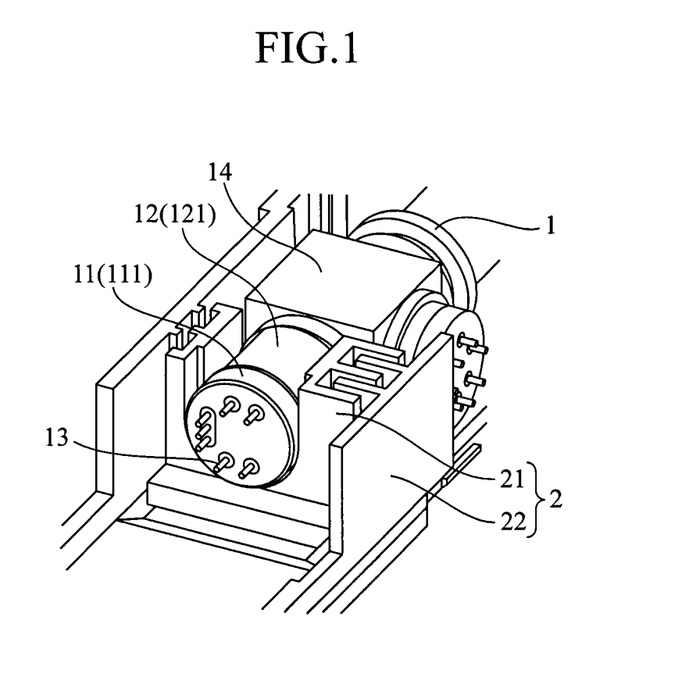
FIG. 1 is a perspective view showing a configuration of a heat dissipation structure according to Embodiment 1 of the present invention.
Figure 2:
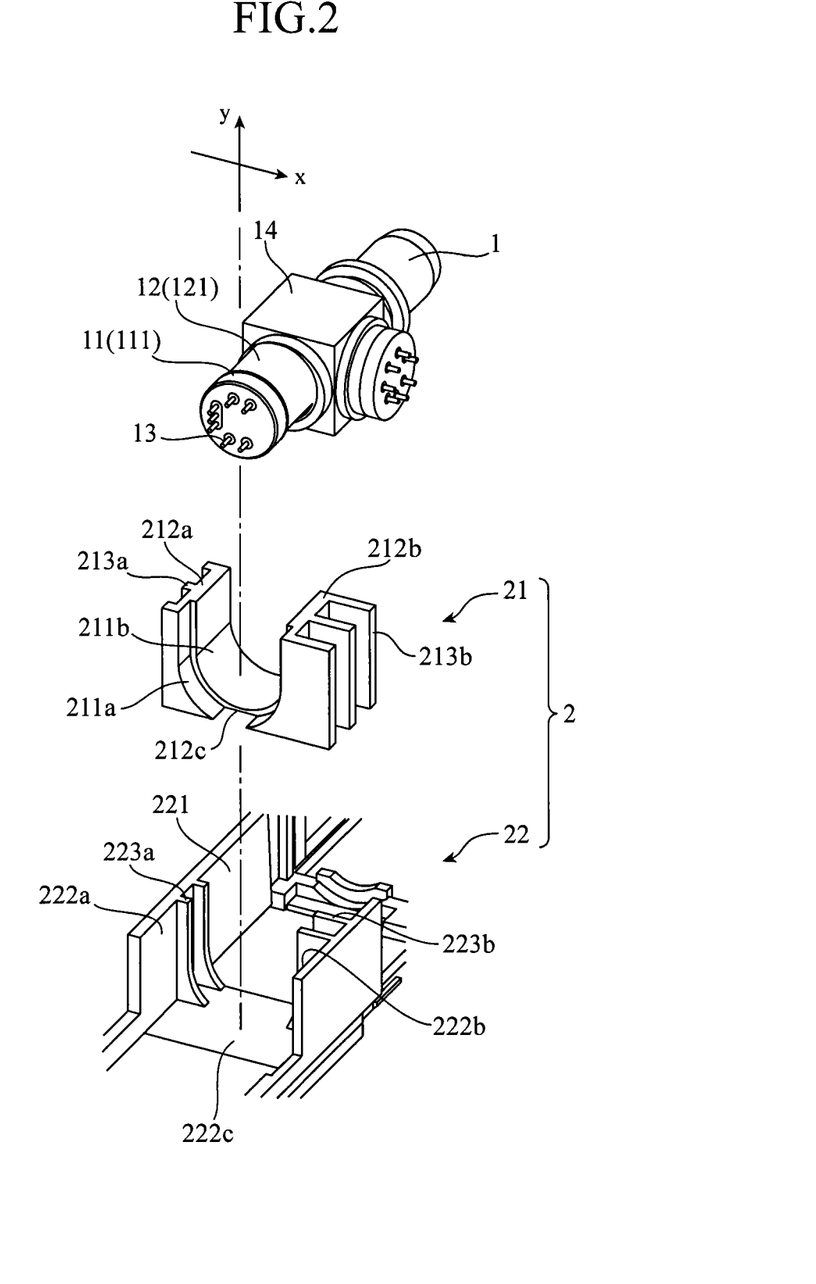
FIG. 2 is an exploded perspective view showing the configuration of the heat dissipation structure according to Embodiment 1 of the invention.

FIG. 1 is a perspective view showing a configuration of a heat dissipation structure 2 according to Embodiment 1 of the present invention, and FIG. 2 is an exploded perspective view thereof. FIG. 1 shows a state in which an optical distributor 1 is accommodated in the heat dissipation structure 2.

First, a configuration of the optical distributor 1 will be described.

The optical distributor 1 has a CAN type package, and contains a semiconductor optical element (not shown) that generates heat. Examples of the semiconductor optical element include a semiconductor laser element (laser diode) and the like. Additionally, the optical distributor 1 may also contain a light receiving element.

As shown in FIGS. 1 and 2, the optical distributor 1 has a disk-like stem 11 on which the semiconductor optical element is to be mounted and a cylindrical part 12 made of a metal that covers the semiconductor optical element on the stem 11. In addition, a plurality of lead pins 13 that are used for supply of a drive current to the semiconductor optical element (or extraction of a signal from the light receiving element) and so on are provided in the stem 11 to pass through the stem 11 except a part thereof.

The heat dissipation structure 2 is a structure for dissipating heat generated in the optical distributor 1 to the outside of the optical distributor 1 and a device (an optical transceiver or the like) on which the heat dissipation structure 2 is mounted. As shown in FIGS. 1 and 2, the heat dissipation structure 2 includes a heat transfer part 21 and a casing 22.

Figure 3:
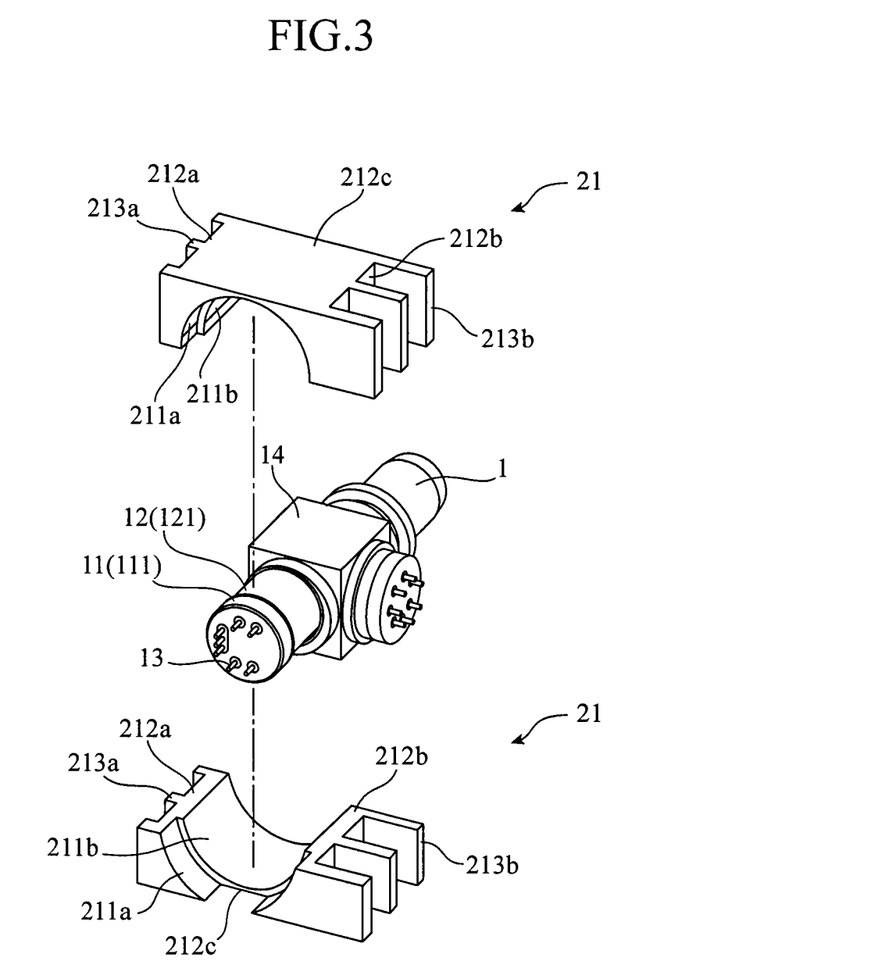
FIG. 3 is an exploded perspective view showing another configuration of the heat dissipation structure according to Embodiment 1 of the invention.

The heat transfer part 21 is a block-like part that is large enough to cover the stem 11 and the cylindrical part 12 of the optical distributor 1, and includes a single part or a plurality of parts. In the case that includes the single heat transfer part 21, for example, a configuration as shown in FIG. 1 is provided. In addition, in the case that includes the plurality of heat transfer parts 21, for example, a configuration as shown in FIG. 3 is provided.

In addition, the heat transfer part 21 has an inner wall that includes: a heat-receiving surface 211a having a curved surface shape along a side surface 111 of the stem 11; and a heat-receiving surface 211b having a curved surface shape along a side surface 121 of the cylindrical part 12. The heat-receiving surfaces 211a and 211b are configured such that the stem 11 and the cylindrical part 12 of the optical distributor 1 can be fitted in the heat-receiving surfaces 211a and 211b. Additionally, a heat dissipation part such as an adhesive or a thermal grease is interposed, or metallic bond by welding or the like is performed between the heat-receiving surface 211a and the side surface 111 of the stem 11, and between the heat-receiving surface 211b and the side surface 121 of the cylindrical part 12.

Further, the heat transfer part 21 has heat-dissipating surfaces 212a to 212c provided on surfaces (outer wall) opposite to the heat-receiving surfaces 211a and 211b. Each of the heat-dissipating surfaces 212a to 212c is a surface for coming in contact with the casing 22 directly or via a thermal grease or the like to transfer the heat generated in the optical distributor 1 to the casing 22. Alternatively, without the provision of the casing 22, a device (e.g., the optical transceiver) on which the optical distributor 1 and the heat transfer part 21 are mounted, or a component mounted on the device may have a shape similar to that of the casing 22 that includes projected and retracted portions that are alternately engaged with the heat-dissipating surfaces 212a and 212b. In this case, each of the heat-dissipating surfaces 212a to 212c serves as a surface for coming in contact with the device or the component directly or via the thermal grease or the like to thus transfer the heat generated in the optical distributor 1 to the device or the component.

Furthermore, the heat-dissipating surfaces 212a and 212b are provided with projected and retracted portions (first projected and retracted portions) 213a and 213b that are alternately engaged with heat-receiving surfaces 222a and 222b of the casing 22. As shown in FIGS. 1 and 2, each of cross sections of the projected and retracted portions 213a and 213b along the axial direction of the stem 11 and the cylindrical part 12 is formed in an uneven shape.

On the other hand, the casing 22 is used to mount the optical distributor 1 and the heat transfer part 21 thereon, and is provided with a substantially U-shaped mounting portion 221. In addition, on an inner wall of the mounting portion 221, the heat-receiving surfaces 222a to 222c are provided at parts opposing the heat-dissipating surfaces 212a to 212c of the heat transfer part 21. Further, the heat-receiving surfaces 222a and 222b are provided with projected and retracted portions (second projected and retracted portions) 223a and 223b that are alternately engaged with the projected and retracted portions 213a and 213b of the heat-dissipating surfaces 212a and 212b of the heat transfer part 21. As shown in FIGS. 1 and 2, each of cross sections of the projected and retracted portions 223a and 223b along the axial direction of the stem 11 and the cylindrical part 12 is formed in the uneven shape.

In this case, when the projected and retracted portions 213a, 213b, 223a, and 223b that are alternately engaged therewith are provided in the heat-dissipating surfaces 212a and 212b of the heat transfer part 21 and the heat-receiving surfaces 222a and 222b of the casing 22, the surface area of a surface where the heat transfer part 21 and the casing 22 are in contact with each other is increased, so that the heat-dissipating area of the heat transfer part 21 and the heat-receiving area of the casing 22 are increased.

Then, in general, an amount of heat (Q) that passes through contact surfaces per unit time is considered to be proportional to a difference in temperature between both the contact surfaces (T_heat-dissipating surface−T_heat-receiving surface) and a surface area (B). Thus, when a proportion coefficient is denoted as h, the amount of heat (Q) is represented by the following expression (1):

$$Q = h*(T\_\text{heat-dissipating surface} - T\_\text{heat-receiving surface})*B \qquad (1).$$

Consequently, when the above projected and retracted portions 213a, 213b, 223a, and 223b are provided, the amount of heat passing through the contact surfaces of the heat transfer part 21 and the casing 22 is increased, and thus, an increase of heat dissipation efficiency thereof can be expected.

Figure 4:
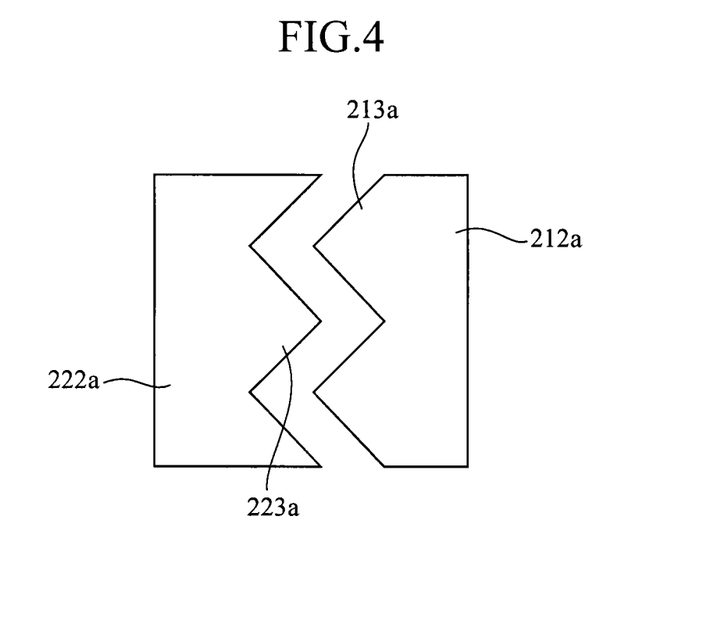
FIG. 4 is a view showing different shapes of projected and retracted portion of a heat transfer part and a casing in Embodiment 1 of the invention.
Figure 5:
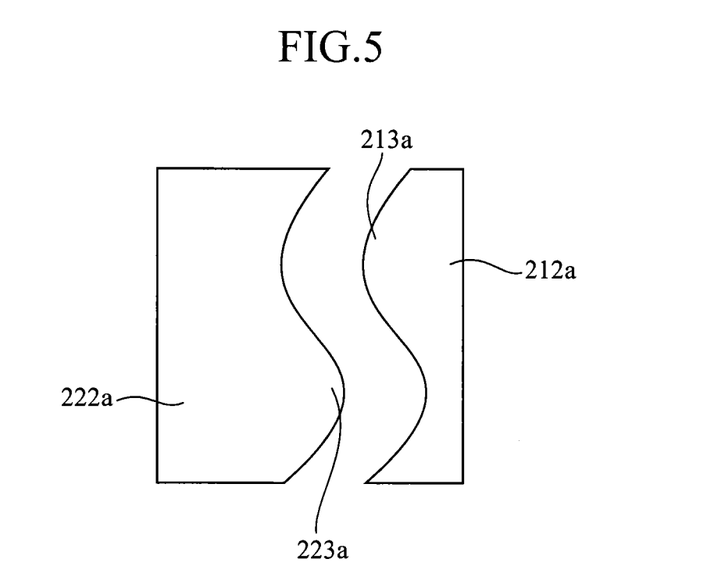
FIG. 5 is a view showing different shapes of the projected and retracted portions of the heat transfer part and the casing in Embodiment 1 of the invention.

Note that each of the projected and retracted portions 213a, 213b, 223a, and 223b may have any form as long as the heat transfer part 21 and the casing 22 are engaged with each other to thus increase the contact area. Therefore, the shape of the projected and retracted portions 213a, 213b, 223a, and 223b is not limited to the uneven shape as shown in FIG. 2, but it may be formed in, for example, a zigzag shape as shown in FIG. 4 or a wave line shape as shown in FIG. 5.

In addition, when the projected portions described above are not provided in the side surface 111 of the stem 11 and the side surface 121 of the cylindrical part 12 and the heat-receiving surfaces 211a and 211b of the heat transfer part 21, but the projected and retracted portions 213a, 213b, 223a, and 223b are provided in the heat-dissipating surfaces 212a and 212b of the heat transfer part 21 and the heat-receiving surfaces 222a and 222b of the casing 22, the heat dissipation efficiency can be expected to increase without an change of the shape of the optical distributor 1.

Note that when the heat dissipation structure 2 has a structure in which the stem 11 that generates the heat and the cylindrical part 12 that is in contact with the stem 11 are brought into direct contact with the casing 22, it is possible to reduce obstruction to the heat dissipation by a gap (air) produced between the heat transfer part 21 and the casing 22. However, there are some cases where it is difficult to adopt such a structure.

That is, the reason is as follows: in a case where the optical distributor 1 requires optical axis adjustment, it is necessary to move the stem 11 and cylindrical part 12 in a direction vertical to the axial direction (an x-axis direction and a y-axis direction shown in FIG. 2) relative to a box-like portion (main body portion) 14 of the optical distributor 1, and it is necessary to consider a positional displacement of the stem 11 and the cylindrical part 12 relative to the box-like portion 14. The positional displacement is larger than a displacement due to a normal dimensional tolerance. The dimensional tolerance is a difference between a maximum value and a minimum value that are allowed as an actual dimension in the event that machining in exactly the same dimension as a reference dimension is impossible. Then, in order to allow the optical distributor 1 and the casing 22 to be assembled in consideration of the positional displacement described above, the gap between the optical distributor 1 and the casing 22 becomes necessary. However, the gap is too large to be filled with an adhesive, a thermal grease or the like.

On the other hand, even when the positional displacement occurs, no shapes of the stem 11 and the cylindrical part 12 change. Accordingly, in the present invention, the heat transfer part 21 is disposed between the optical distributor 1 and the casing 22, and it is thus configured such that the gap is not produced between the stem 11 and the cylindrical part 12, and the heat transfer part 21 as much as possible. In such a way, it is possible to reduce the obstruction to the heat dissipation by the gap (air), which enables to enhance the heat dissipation effect.

Figure 6A:
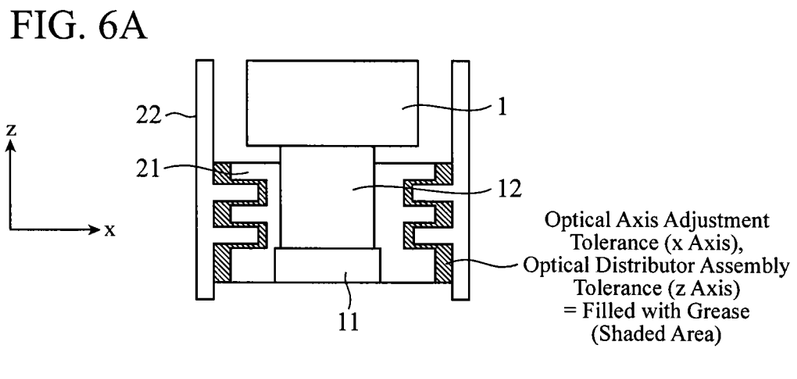
Figure 6B:
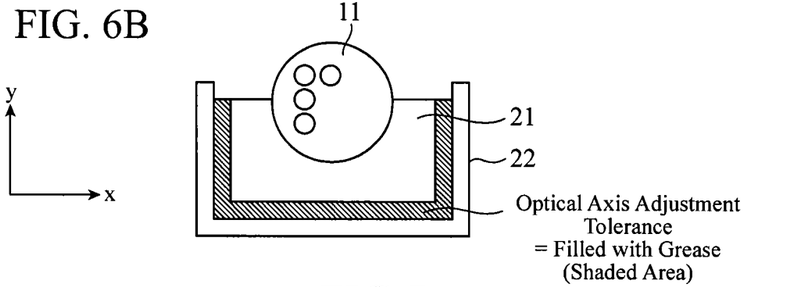

Note that in consideration of the above positional displacement resulting from the optical axis adjustment and the dimensional tolerances of the individual parts (the optical distributor 1, the heat transfer part 21, and the casing 22), it is necessary to allow the assembly of the individual parts even when the above positional displacement and the dimensional tolerances of the individual parts have the maximum values. Accordingly, as shown in FIGS. 6A, 6B, it is configured such that the gap is provided between the heat transfer part 21 and the casing 22. Note that the gap has a value that no individual parts hit against each other even when the above positional displacement and the dimensional tolerances of the individual parts have the maximum values.

In this case, the gap in a z-axis direction shown in FIG. 6A is a gap for allowing the assembly of the individual parts. Additionally, the gaps in an x-axis direction and a y-axis direction as shown in FIGS. 6A, 6B correspond to an optical axis adjustment tolerance of the stem 11 and the cylindrical part 12 (also serve as the gaps for allowing the assembly of the individual parts). Further, the gaps are filled with the heat dissipation part such as the thermal grease or the like.

Then, the case where the heat-dissipating surfaces 212a to 212c come in direct contact with the casing 22 corresponds to the case where the optical axis adjustment tolerance and the dimensional tolerance (assembly tolerance) have the maximum values (lower-limit/upper limit values). Additionally, in a case where the heat-dissipating surfaces 212a to 212c come in contact with the casing 22, the heat is easily transmitted, and hence, the heat dissipation efficiency is increased.

Thus, it is possible to allow the assembly of the optical distributor 1 in which the positions of the stem 11 and the cylindrical part 12 are displaced relative to the box-like portion 14 while the positions of the box-like portion 14 of the optical distributor 1 and the casing 22 are kept constant.

On the other hand, in the case of the optical distributor 1 that does not require the optical axis adjustment, it is considered that the heat dissipation effect can be enhanced by bringing the stem 11 and the cylindrical part 12 into direct contact with the casing 22 without using the present invention. However, in order to obtain optical transmission power required in the optical distributor 1 that does not require the optical axis adjustment, in general, it is necessary to increase the size of the component and use the expensive optical distributor. That is, a market need for a reduction in size cannot be satisfied.

In contrast to this, when the configuration of the present invention is applied thereto, it is possible to obtain the optical transceiver that uses the small optical distributor 1 of which the optical axis is adjusted so as to obtain the required optical transmission power. Thus, it becomes possible to achieve the reduction in size of the optical transceiver.

Further, the optical distributor 1 typically has a Peltier element. The Peltier element consumes electric power. In contrast, when the present invention capable of increasing the heat dissipation efficiency with the heat dissipation structure 2 is employed, it is possible to reduce the power consumption due to cooling using the Peltier element.

As described above, according to Embodiment 1, since it is configured to include: the heat transfer part 21 having the heat-receiving surfaces 211a and 211b which have the curved surface shapes along the side surfaces 111 and 121 of the stem 11 and the cylindrical part 12, and in which the stem 11 and the cylindrical part 12 can be fitted, and having the heat-dissipating surfaces 212a and 212b that are provided with the projected and retracted portions 213a and 213b; and the casing 22 having the optical distributor 1 and the heat transfer part 21 mounted thereon and having the heat-receiving surfaces 222a and 222b that are provided with the projected and retracted portions 223a and 223b engaged with the projected and retracted portions 213a and 213b of the heat transfer part 21, the heat dissipation efficiency is increased due to the increase in the contact area between the heat transfer part 21 and the casing 22 to thereby dissipate efficiently the heat of the optical distributor 1. As a result, it is possible to achieve an increase in the heat generation density of the optical distributor 1, a reduction in size of the casing 22, and enlargement of an operating temperature range to a temperature increase.

Embodiment 2

In Embodiment 2, there is shown a case where by using the cylindrical shapes of the stem 11 and the cylindrical part 12, the projected and retracted portions 213a and 213b of the heat transfer part 21 and the projected and retracted portions 223a and 223b of the casing 22 are formed in curved surface shapes conforming to the corresponding cylindrical shapes.

Figure 7:
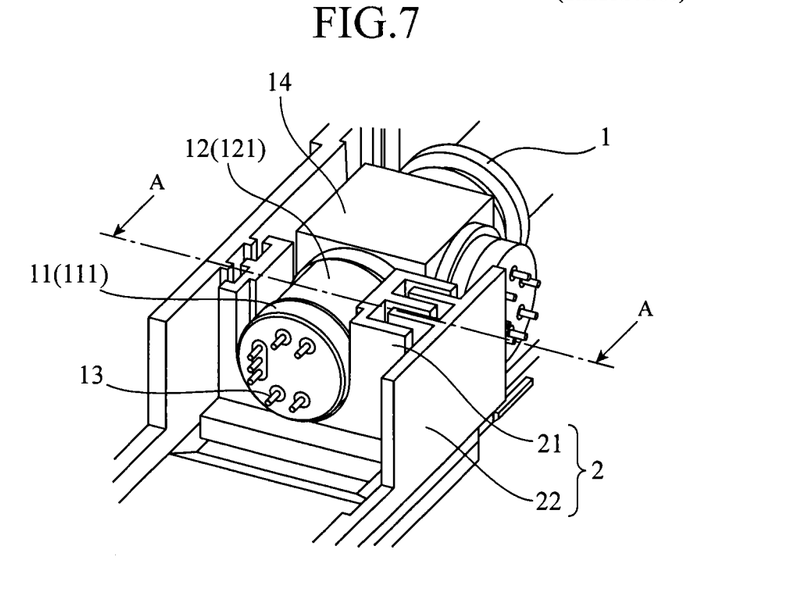
FIG. 7 is a perspective view showing a configuration of a heat dissipation structure according to Embodiment 2 of the invention.
Figure 8:
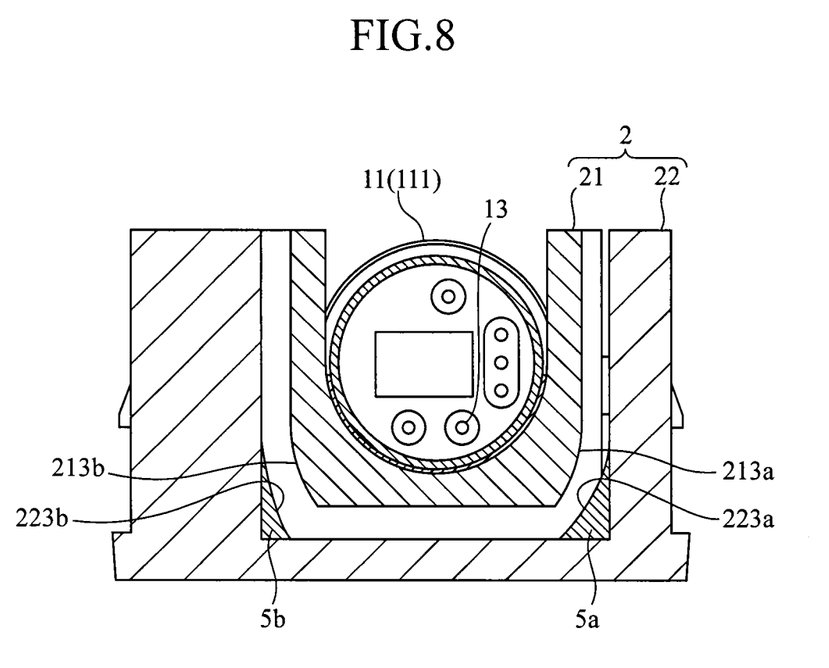
FIG. 8 is an enlarged cross-sectional view taken along a line A-A of FIG. 7.

FIG. 7 is a perspective view showing a configuration of a heat dissipation structure 2 of an optical distributor 1 according to Embodiment 2 of the present invention, and FIG. 8 is an enlarged cross-sectional view taken along a line A-A of FIG. 7. In FIGS. 7 and 8, the same components as those of the heat dissipation structure 2 according to Embodiment 1 shown in FIGS. 1 and 2 are designated by the same reference numerals, and only different parts will be explained.

As shown in FIG. 8, the cross sections of the projected and retracted portions 213a and 213b of the heat transfer part 21 in Embodiment 2 that are substantially vertical to the axis of the stem 11 and the cylindrical part 12 are formed in curved surface shapes along the side surfaces 111 and 121 of the stem 11 and the cylindrical part 12. In addition, the cross sections of the projected and retracted portions 223a and 223b of the casing 22 in Embodiment 2 that are substantially vertical to the axis of the stem 11 and the cylindrical part 12 are also similarly formed in the curved surface shapes along the side surfaces 111 and 121 of the stem 11 and the cylindrical part 12.

In this manner, the heat dissipation area is increased by an area corresponding to shaded areas 5a and 5b shown in FIG. 8 as compared with the configuration of Embodiment 1, and hence an increase of the heat dissipation efficiency can be expected.

Embodiment 3

In each of Embodiments 1 and 2, there is shown the case where the heat-dissipating surfaces 212a and 212b of the heat transfer part 21 and the heat-receiving surfaces 222a and 222b of the casing 22 are provided with the projected and retracted portions 213a, 213b, 223a, and 223b. In contrast to this, in Embodiment 3, there is shown a case where the heat-dissipating surface 212c of the heat transfer part 21 is provided with groove portions 214a and 214b, and the heat-receiving surface 222c of the casing 22 is provided with projected portions 224a and 224b that are engaged with the groove portions 214a and 214b.

Figure 9:
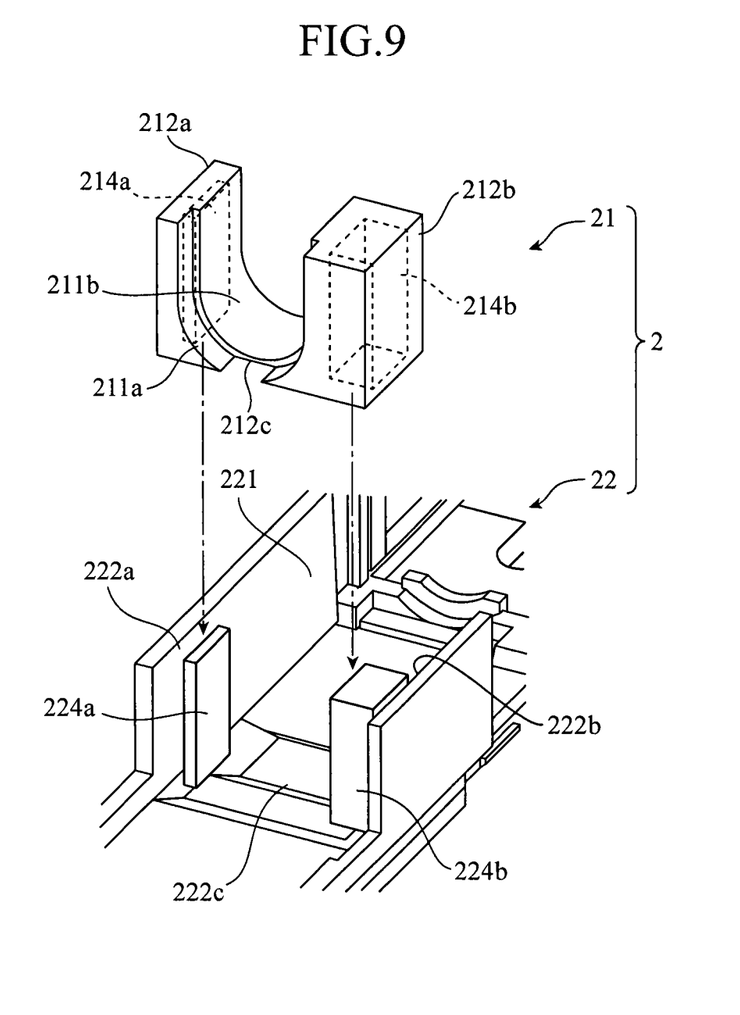
FIG. 9 is an exploded perspective view showing a configuration of a heat dissipation structure according to Embodiment 3 of the invention.

FIG. 9 is an exploded perspective view showing a configuration of a heat dissipation structure 2 of an optical distributor 1 according to Embodiment 3 of the present invention. Note that in FIG. 9, the depiction of the optical distributor 1 is omitted. In FIG. 9, the same components as those of the heat dissipation structure 2 according to Embodiment 1 shown in FIGS. 1 and 2 are designated by the same reference numerals, and only different parts will be explained.

As shown in FIG. 9, in the heat transfer part 21 in Embodiment 3, the heat-dissipating surface 212c is provided with the groove portions 214a and 214b instead of the projected and retracted portions 213a and 213b. In addition, in the casing 22 in Embodiment 3, the heat-receiving surface 222c is provided with the projected portions 224a and 224b that are engaged with the groove portions 214a and 214b instead of the projected and retracted portion 223a and 223b.

In this manner, the groove portion 214a of the heat transfer part 21 is engaged with the projected portion 224a of the casing 22, and the groove portion 214b is engaged with the projected portion 224b. As a result, similarly to Embodiment 1, the heat dissipation efficiency is increased by an increase in the contact area between the heat transfer part 21 and the casing 22 to thereby effectively dissipate the heat of the optical distributor 1.

Embodiment 4

Figure 10:
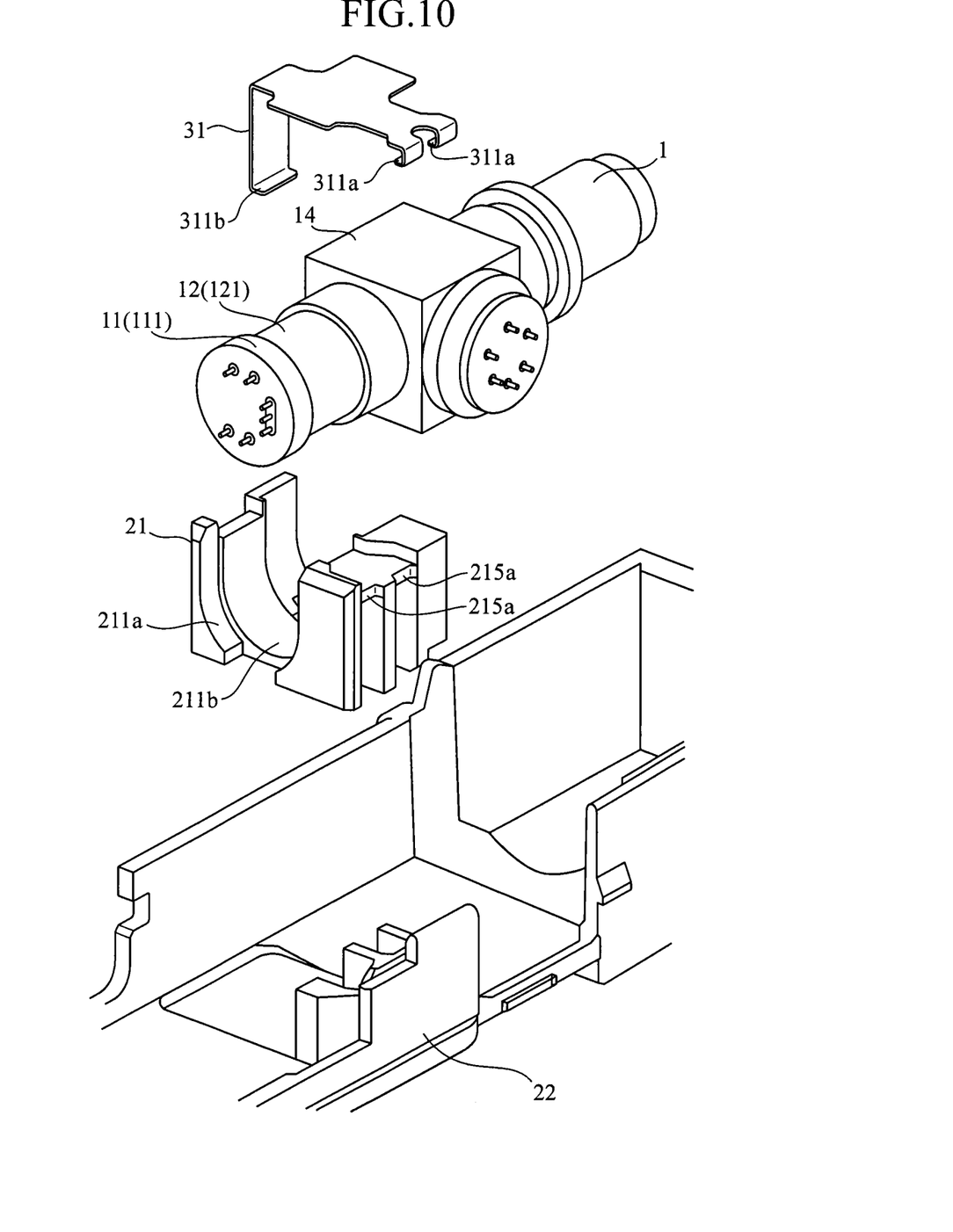
FIG. 10 is an exploded perspective view showing a configuration of a heat dissipation structure according to Embodiment 4 of the invention.

In the configurations of Embodiments 1 to 3, when the stem 11 is bonded to the heat transfer part 21, there are some cases where the heat transfer efficiency is reduced depending on an application condition of the adhesive. In addition, it takes time to dry the adhesive, which poses a problem of poor productivity thereof. Accordingly, in Embodiment 4, as shown in FIG. 10, the stem 11 is configured to be fixed such that the cylindrical part 12 is pinched and fixed together with the heat transfer part 21 with a plate spring 31.

The plate spring 31 is configured to be attachable to the heat transfer part 21, and fixes the stem 11 by pinching and fixing the cylindrical part 12 together with the heat transfer part 21. As shown in FIG. 10, the plate spring 31 is obtained by bending a plate part in an L shape, and bent portions 311a and 311b to be engaged with engaging portions 215a and 215b of the heat transfer part 21 are provided at both end sides in the longitudinal direction.

Figure 12:
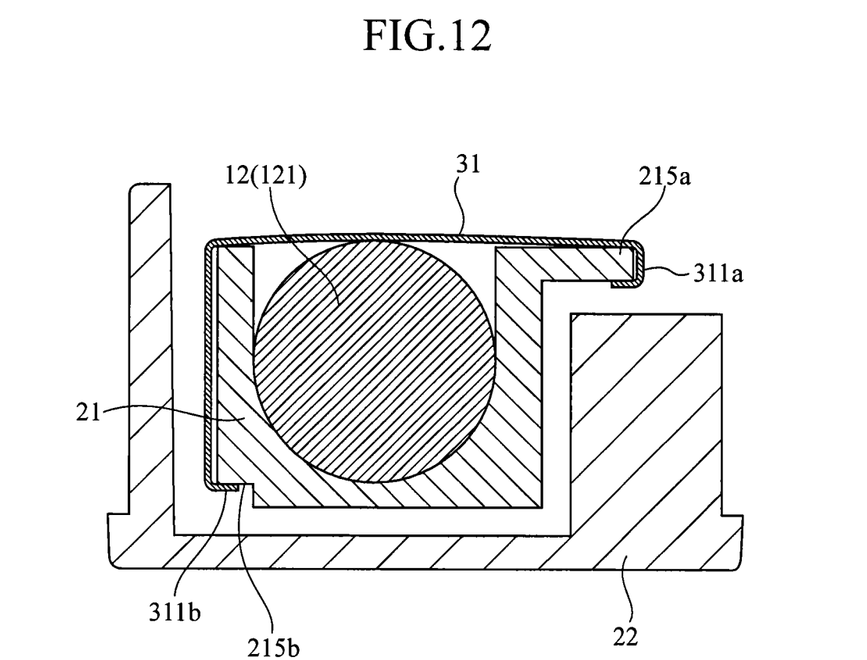
FIG. 12 is an enlarged cross-sectional view taken along a line B-B of FIG. 11.

In addition, the heat transfer part 21 is provided with the engaging portions 215a and 215b with which the bent portions 311a and 311b of the plate spring 31 are engaged (see FIG. 12).

Figure 11:
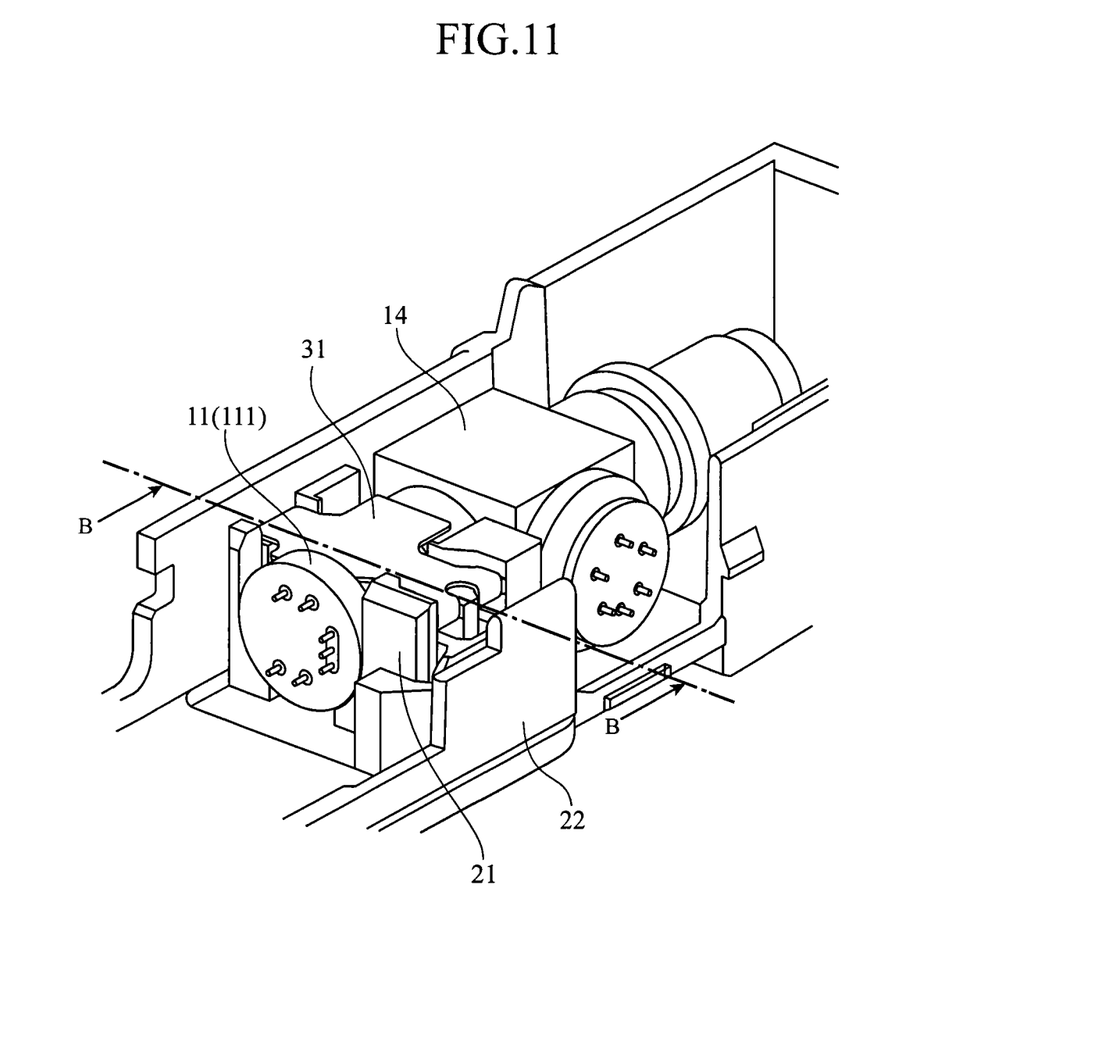
FIG. 11 is a perspective view showing the configuration of the heat dissipation structure according to Embodiment 4 of the invention.

FIG. 11 shows a perspective view when the plate spring 31 is attached thereto, and FIG. 12 shows an enlarged cross-sectional view taken along a line B-B of FIG. 11. The plate spring 31 is attached to the heat transfer part 21 in which the cylindrical part 12 is accommodated. On this occasion, the bent portions 311a and 311b of the plate spring 31 are engaged with the engaging portions 215a and 215b of the heat transfer part 21. In this manner, the plate spring 31 pinches and fixes the cylindrical part 12 together with the heat transfer part 21. Note that a space created by the heat transfer part 21 and the plate spring 31 when the plate spring 31 is attached is designed so as to be smaller than the diameter of the cylindrical part 12 of the optical distributor 1 even at the time of the worst tolerance. Thus, the plate spring 31 is bent, and it is possible to bring the cylindrical part 12 into tight contact with the heat transfer part 21 in a state in which a load is constantly applied to the cylindrical part 12, and hence the heat transfer efficiency is stabilized. In addition, time required to dry an adhesive or the like is not necessary, and hence productivity thereof is improved.

Note that when attached to the heat transfer part 21, the plate spring 31 has a function of bending and applying the load to the cylindrical part 12 and a function of dissipating the heat of the cylindrical part 12 to the heat transfer part 21, and hence the plate spring 31 is preferably made of a metal.

It is to be understood that a free combination of individual Embodiments, variations of any components of individual Embodiments, or removal of any components of individual Embodiments is possible within the scope of the invention.

INDUSTRIAL APPLICABILITY

The heat dissipation structure and the optical transceiver according to the present invention are capable of efficiently dissipating the heat of the optical distributor, and are suitably used as, for example, the heat dissipation structure that dissipates the heat of the optical distributor having the stem on which the semiconductor optical element is mounted and the cylindrical part that covers the semiconductor optical element on the stem and the optical transceiver that includes the optical distributor and the heat dissipation structure.

DESCRIPTION OF REFERENCE NUMERALS AND SIGNS 1 optical distributor, 2 heat dissipation structure, 5a, 5b shaded area, 11 stem, 12 cylindrical part, 13 lead pin, 14 box-like portion, 21 heat transfer part, 22 casing, 31 plate spring, 111, 121 side surface, 211a, 211b, 222a to 222c heat-receiving surface, 212a to 212c heat-dissipating surface, 213a, 213b, 223a, 223b projected and retracted portion (first and second projected and retracted portions), 224a, 224b projected portion, 214a, 214b groove portion, 215a, 215b engaging portion, 221 mounting portion, 311a, 311b bent portion.

The invention claimed is:

1. A heat dissipation structure dissipating heat of an optical distributor having a stem having a semiconductor element mounted thereon and a cylindrical part covering the semiconductor element on the stem, comprising:
   a heat transfer part having a heat-receiving surface which has a curved surface shape along side surfaces of the stem and the cylindrical part and in which the stem and the cylindrical part can be fitted, and having a heat-dissipating surface which is provided with a first projected and retracted portion with alternating projections and retractions defining first surfaces extending in a direction perpendicular to an axis of the cylindrical part; and
   a casing having the optical distributor and the heat transfer part mounted thereon and having a heat-receiving surface provided with a second projected and retracted portion with alternating projections and retractions defining second surfaces extending in a direction perpendicular to an axis of the cylindrical part, which second surfaces engage with the first surfaces.

2. The heat dissipation structure according to claim 1, wherein
   each of cross sections of the first and second projected and retracted portions along an axial direction of the stem and the cylindrical part has an uneven shape.

3. The heat dissipation structure according to claim 1, wherein
   each of cross sections of the first and second projected and retracted portions along an axial direction of the stem and the cylindrical part has a zigzag shape.

4. The heat dissipation structure according to claim 1, wherein
   each of cross sections of the first and second projected and retracted portions along an axial direction of the stem and the cylindrical part has a wave line shape.

5. The heat dissipation structure according to claim 1, wherein
   each of the first and second projections and retractions has a curved surface shape along the side surfaces of the stem and the cylindrical part.

6. The heat dissipation structure according to claim 1, wherein
   an optical axis adjustment of the optical distributor is performed in such a manner that the stem and the cylindrical part is moved in a direction substantially vertical to an axial direction relative to a main body portion.

7. A heat dissipation structure of an optical distributor dissipating heat of the optical distributor having a stem having a semiconductor element mounted thereon and a cylindrical part covering the semiconductor element on the stem, comprising:
   a heat transfer part having a heat-receiving surface which has a curved surface shape along side surfaces of the stem and the cylindrical part and in which the stem and the cylindrical part can be fitted, and having a heat-dissipating surface provided with a groove portion defining first surfaces extending in a direction perpendicular to an axis of the cylindrical part and extending into the heat transfer part; and
   a casing having the optical distributor and the heat transfer part mounted thereon and having a heat-receiving surface provided with a projected portion defining second surfaces extending in a direction perpendicular to an axis of the cylindrical part and engaged with the first surfaces.

8. The heat dissipation structure according to claim 7, wherein
   an optical axis adjustment of the optical distributor is performed in such a manner that the stem and the cylindrical part is moved in a direction substantially vertical to an axial direction relative to a main body portion.

9. An optical transceiver including an optical distributor comprising: a stem having a semiconductor element mounted thereon and a cylindrical part covering the semiconductor element on the stem; and a heat dissipation structure dissipating heat of the optical distributor, wherein
   the heat dissipation structure includes a heat transfer part having a heat-receiving surface which has a curved surface shape along side surfaces of the stem and the cylindrical part and in which the stem and the cylindrical part can be fitted, and having a heat-dissipating surface provided with a first projected and retracted portion with alternating projections and retractions defining first surfaces extending in a direction perpendicular to an axis of the cylindrical part, and
   a casing having the optical distributor and the heat transfer part mounted thereon, and having a heat-receiving surface provided with a second projected and retracted portion with alternating projections and retractions defining second surfaces extending in a direction perpendicular to an axis of the cylindrical part, which second surfaces engage with the first surfaces.

10. The optical transceiver according to claim 9, wherein
    an optical axis adjustment of the optical distributor is performed in such a manner that the stem and the cylindrical part is moved in a direction substantially vertical to an axial direction relative to a main body portion.

11. An optical transceiver including an optical distributor having a stem having a semiconductor element mounted thereon, and a cylindrical part covering the semiconductor element on the stem and a heat dissipation structure dissipating heat of the optical distributor, wherein
    the heat dissipation structure includes a heat transfer part having a heat-receiving surface which has a curved surface shape along side surfaces of the stem and the cylindrical part and in which the stem and the cylindrical part can be fitted, and having a heat-dissipating surface provided with a groove portion defining first surfaces extending in a direction perpendicular to an axis of the cylindrical part and extending into the heat transfer part, and
    a casing having the optical distributor and the heat transfer part mounted thereon, and having a heat-receiving surface provided with a projected portion defining second surfaces extending in a direction perpendicular to an axis of the cylindrical part and engaged with the first surfaces.

12. The optical transceiver according to claim 11, wherein
    an optical axis adjustment of the optical distributor is performed in such a manner that the stem and the cylindrical part is moved in a direction substantially vertical to an axial direction relative to a main body portion.

* * * * *